United States Patent
Ohashi et al.

(10) Patent No.: US 11,233,188 B2
(45) Date of Patent: Jan. 25, 2022

(54) ULTRASONIC WAVE SENSOR AND ULTRASONIC WAVE DEVICE

(71) Applicant: Seiko Epson Corporation, Tokyo (JP)

(72) Inventors: Koji Ohashi, Matsumoto (JP); Chikara Kojima, Matsumoto (JP)

(73) Assignee: Seiko Epson Corporation

( * ) Notice: Subject to any disclaimer, the term of this patent is extended or adjusted under 35 U.S.C. 154(b) by 126 days.

(21) Appl. No.: 16/366,296

(22) Filed: Mar. 27, 2019

(65) Prior Publication Data

US 2019/0305208 A1     Oct. 3, 2019

(30) Foreign Application Priority Data

Mar. 28, 2018   (JP) .............................. JP2018-061550

(51) Int. Cl.
| | |
|---|---|
| *G01N 29/24* | (2006.01) |
| *H01L 41/113* | (2006.01) |
| *H01L 41/047* | (2006.01) |
| *B06B 1/02* | (2006.01) |
| *H01L 41/04* | (2006.01) |

(52) U.S. Cl.
CPC ........ *H01L 41/1132* (2013.01); *B06B 1/0207* (2013.01); *G01N 29/2437* (2013.01); *H01L 41/042* (2013.01); *H01L 41/047* (2013.01)

(58) Field of Classification Search
CPC . H01L 41/1132; H01L 41/047; H01L 41/042; G01N 29/2437; G01N 2291/106; B06B 1/0207; G01H 11/08; H04R 17/005; G10K 9/122
See application file for complete search history.

(56) References Cited

U.S. PATENT DOCUMENTS

| | | |
|---|---|---|
| 2002/0073781 A1 | 6/2002 | Hashimoto et al. |
| 2007/0299345 A1 | 12/2007 | Adachi et al. |
| 2009/0085440 A1* | 4/2009 | Nakamura ............ B06B 1/0622 310/334 |
| 2014/0221840 A1* | 8/2014 | Ko ....................... A61B 8/4444 600/459 |

(Continued)

FOREIGN PATENT DOCUMENTS

| | | |
|---|---|---|
| JP | H08-084397 A | 3/1996 |
| JP | 2000-341796 A | 12/2000 |
| JP | 2001-309493 A | 11/2001 |

(Continued)

*Primary Examiner* — Xin Y Zhong
(74) *Attorney, Agent, or Firm* — Harness, Dickey & Pierce, P.L.C.

(57) ABSTRACT

An ultrasonic wave sensor includes an oscillating plate including a plurality of oscillators, a wall portion provided on the oscillating plate and surrounding the oscillator, a first piezoelectric element provided in the predetermined number of oscillators among the plurality of oscillators, and a second piezoelectric element provided in the oscillator where the first piezoelectric element is not provided. An input and an output of a drive signal are possible to the first piezoelectric element, and the first piezoelectric element is connected to at least another first piezoelectric element in parallel. The second piezoelectric element is electrically insulated from the first piezoelectric element. The second piezoelectric element is disposed between the first piezoelectric elements adjacent in one direction.

10 Claims, 10 Drawing Sheets

(56) References Cited

U.S. PATENT DOCUMENTS

| | | |
|---|---|---|
| 2014/0241112 A1 | 8/2014 | Kano |
| 2016/0284973 A1 | 9/2016 | Ohashi |

FOREIGN PATENT DOCUMENTS

| | | |
|---|---|---|
| JP | 2004-057460 A | 2/2004 |
| JP | 2006-122188 A | 5/2006 |
| JP | 2012-039495 A | 2/2012 |
| JP | 2014-161707 A | 9/2014 |
| JP | 2016-184821 A | 10/2016 |
| JP | 2017-034057 A | 2/2017 |

* cited by examiner

ULTRASONIC WAVE SENSOR AND ULTRASONIC WAVE DEVICE

BACKGROUND

1. Technical Field

The present invention relates to an ultrasonic wave sensor and an ultrasonic wave device.

2. Related Art

In the related art, an ultrasonic wave sensor that transmits and receives an ultrasonic wave by oscillating an oscillating plate is known (for example, JP-A-2017-34057).

In the ultrasonic wave sensor disclosed in JP-A-2017-34057, an oscillation film and an ultrasonic wave transducer configured by including a piezoelectric element disposed on the oscillation film are disposed in a matrix in an XY direction. In the ultrasonic wave sensor, an ultrasonic wave transducer column (channel) is configured of each ultrasonic wave transducer disposed along a Y direction among a plurality of the ultrasonic wave transducers and a plurality of the channels are disposed along an X direction.

In the ultrasonic wave sensor disclosed in JP-A-2017-34057, it is considered that the number of ultrasonic wave transducers (number of elements) included in one channel is increased in order to increase a sound pressure of the ultrasonic wave transmitted from the ultrasonic wave sensor. However, when the number of elements included in the channel is increased, drive characteristics for driving the ultrasonic wave sensor are degraded due to the increase in total electrical capacitance (total electrostatic capacitance) in the entire of the channel.

SUMMARY

An advantage of some aspects of the invention is to provide the ultrasonic wave sensor and an ultrasonic wave device capable of suppressing the degradation of the drive characteristics and achieving the increase in a transmission sound pressure of the ultrasonic wave.

An ultrasonic wave sensor according to this application example includes an oscillating plate including a plurality of oscillators, a wall portion provided on the oscillating plate and surrounding the oscillator, a first piezoelectric element provided in the predetermined number of oscillators among the plurality of oscillators, and a second piezoelectric element provided in the oscillator where the first piezoelectric element is not provided. An input and an output of a drive signal are possible to the first piezoelectric element, and the first piezoelectric element is connected to at least another first piezoelectric element in parallel. The second piezoelectric element is electrically insulated from the first piezoelectric element. The second piezoelectric element is disposed between the first piezoelectric elements adjacent in one direction.

In the ultrasonic wave sensor according to the application example, the plurality of oscillators surrounded by the wall portion are provided on the oscillating plate, and the first piezoelectric element is disposed in the predetermined number of oscillators among the oscillators and the second piezoelectric element is disposed in a remaining oscillator. The first piezoelectric element is a piezoelectric element electrically connected to at least another first piezoelectric element in parallel, and the plurality of first piezoelectric elements connected in parallel are driven at the same time when the drive signal is input. On the other hand, the second piezoelectric element is a piezoelectric element electrically insulated from the first piezoelectric element and disposed between the first piezoelectric elements adjacent in one direction. In the following description, there is a case where an ultrasonic wave transducer configured of the first piezoelectric element and the oscillator in which the first piezoelectric element is disposed is referred to as a drive transducer, and an ultrasonic wave transducer configured of the second piezoelectric element and the oscillator in which the second piezoelectric element is disposed is referred to a non-drive transducer.

In the application example as described above, when the drive signal is input to the first piezoelectric element, the first piezoelectric element is expanded and contracted, the oscillator in which the first piezoelectric element is disposed oscillates, and thus the ultrasonic wave is transmitted from the drive transducer. At the time, the oscillation of the oscillator of the drive transducer propagates to the oscillator in which the second piezoelectric element is disposed through the oscillating plate (mechanical crosstalk). Accordingly, the oscillator of the non-drive transducer resonates and the ultrasonic wave is transmitted also from the non-drive transducer. That is, in the application example, since the ultrasonic wave is transmitted also from the non-drive transducer disposed near the drive transducer only by driving the drive transducer, it is possible to transmit the ultrasonic wave with high sound pressure from the ultrasonic wave sensor.

Further, with such a configuration, it is unnecessary to increase the number of first piezoelectric elements to which the drive signal is input in order to increase the sound pressure of the transmission ultrasonic wave. Accordingly, the total electrostatic capacitance of all the drive transducers connected in parallel does not increase. Therefore, it is possible to increase the sound pressure of the transmission ultrasonic wave while suppressing the degradation of the drive characteristics.

In the ultrasonic wave sensor according to the application example, it is preferable that the ultrasonic wave sensor further includes a first area where an element group configured by including the predetermined number of first piezoelectric elements connected in parallel is disposed, on the oscillating plate, a plurality of the first areas are disposed in a first direction, and the second piezoelectric element is disposed between the first areas adjacent in the first direction.

In the application example with this configuration, one element group is configured of the first piezoelectric elements connected in parallel. The plurality of first areas where the element group is disposed are disposed along the first direction on the oscillating plate, and the second piezoelectric element, that is, the non-drive transducer is disposed between the plurality of first areas.

In this manner, in the case where a plurality of element groups are disposed in the first direction, it is possible to transmit the ultrasonic wave with higher sound pressure from the ultrasonic wave sensor by, for example, driving each element group at the same time. Further, when each element group is driven with delay, a transmission direction of the ultrasonic wave can be exited in a direction according to a delay time and thus it is also possible to control the transmission direction of the ultrasonic wave. In the application example, the non-drive transducer is disposed between the first areas adjacent in the first direction. With such a configuration, the oscillator of the non-drive transducer disposed adjacent in the first area can resonate by driving the element group (drive transducer) in the first area. Accordingly, it is possible to increase the sound pressure of the ultrasonic wave when the element group in the first area is driven while suppressing the degradation of the drive characteristics of the ultrasonic wave sensor.

In the ultrasonic wave sensor according to the application example, it is preferable that a plurality of the second piezoelectric elements are disposed surrounding the first area.

In the application example with this configuration, the plurality of second piezoelectric elements (non-drive transducers) are disposed so as to surround the first area. Accordingly, it is possible to increase the number of non-drive transducers resonating when the element group in the first area is driven, for example, as compared with the case where the non-drive transducer is disposed only between the first areas adjacent in the first direction. Accordingly, it is possible to transmit the ultrasonic wave with higher sound pressure.

In the ultrasonic wave sensor according to the application example, it is preferable that the first area includes a plurality of the first piezoelectric elements disposed in the first direction, and the second piezoelectric element is disposed between the first piezoelectric elements adjacent in the first direction.

In the application example with this configuration, the non-drive transducer is disposed not only between the first areas adjacent in the first direction but also between the drive transducers adjacent in the first direction in the first area. Accordingly, it is possible to decrease the total electrostatic capacitance as compared with the case where all the ultrasonic wave transducers in the first area are the drive transducers and thus to improve the drive characteristics of the ultrasonic wave sensor. Further, since the oscillator of the non-drive transducer in the first area also resonates when the drive transducer is driven, it is possible to transmit the ultrasonic wave with high sound pressure.

In the ultrasonic wave sensor according to the application example, it is preferable that the first area includes the plurality of the first piezoelectric elements disposed in a second direction intersecting the first direction, and the second piezoelectric element is disposed between the first piezoelectric elements adjacent in the second direction.

In the application example with this configuration, the non-drive transducer is disposed also between the drive transducers adjacent in the second direction intersecting the first direction. Accordingly, it is possible to decrease the total electrostatic capacitance as compared with the case where all the ultrasonic wave transducers in the first area are the drive transducers and thus to improve the drive characteristics of the ultrasonic wave sensor. Further, since the oscillator of the non-drive transducer in the first area also resonates when the drive transducer is driven, it is possible to transmit the ultrasonic wave with high sound pressure.

An ultrasonic wave device according to an application example includes the ultrasonic wave sensor according to the application example described above and a drive circuit that inputs the drive signal to the first piezoelectric element.

In the application example, as described above, when the drive signal is input to the drive transducer configuring the first piezoelectric element to drive the drive transducer, it is possible to oscillate the oscillator of the non-drive transducer adjacent to the drive transducer and thus to transmit the ultrasonic wave with high sound pressure. Further, it is possible to increase the sound pressure of the transmission ultrasonic wave while suppressing the degradation of the drive characteristics without increasing the total electrostatic capacitance due to the number of drive transducers connected in parallel. Therefore, it is possible to simplify the configuration of the drive circuit that outputs the drive signal to the ultrasonic wave sensor.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a first embodiment of the invention will be described.

Figure 1:
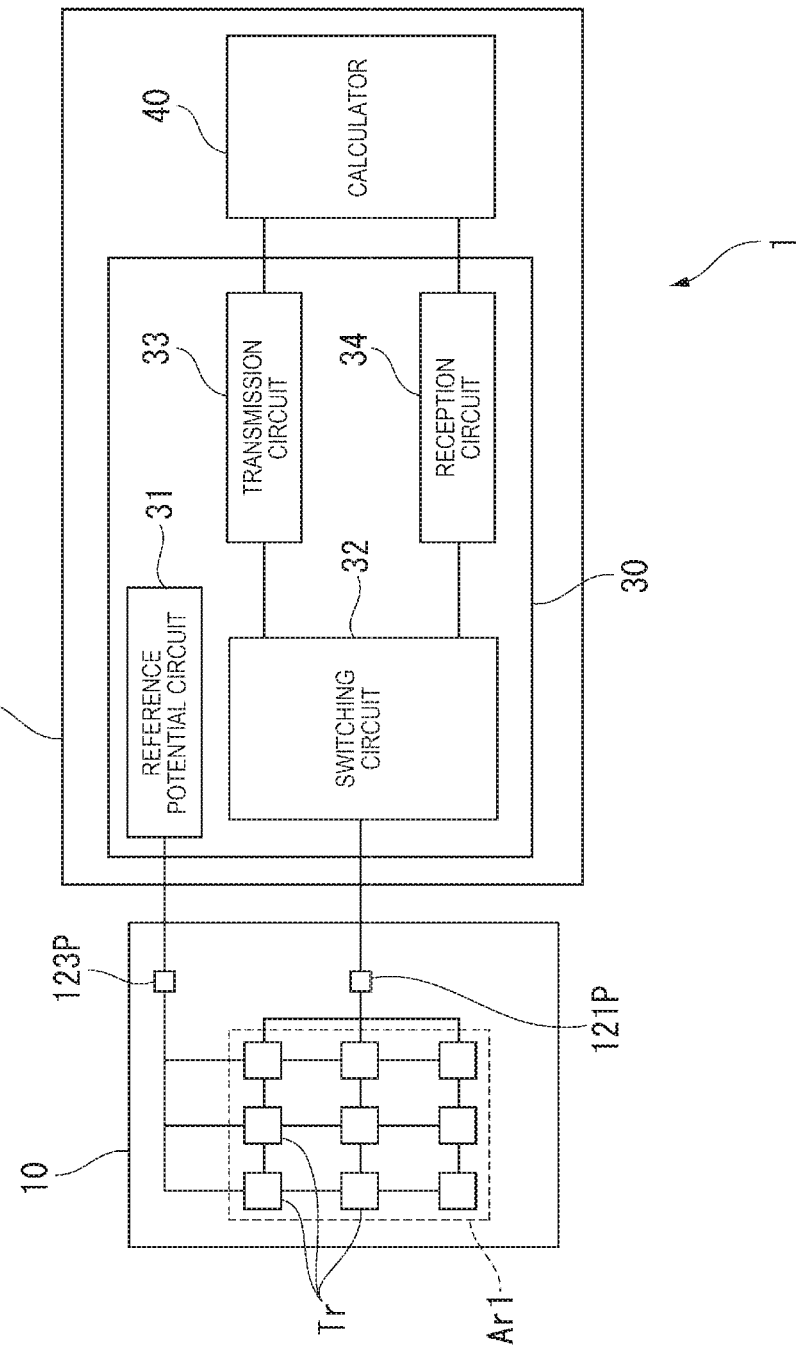
FIG. 1 is a block diagram showing a schematic configuration of a distance measurement device which is an example of an ultrasonic wave device according to a first embodiment.

FIG. 1 is a block diagram showing a schematic configuration of a distance measurement device 1 which is an example of an ultrasonic wave device according to a first embodiment.

As shown in FIG. 1, the distance measurement device 1 according to the embodiment includes an ultrasonic wave sensor 10 and a controller 20 that controls the ultrasonic wave sensor 10. In the distance measurement device 1, the controller 20 controls the ultrasonic wave sensor 10 through a drive circuit 30 and transmits an ultrasonic wave from the ultrasonic wave sensor 10. When the ultrasonic wave is reflected by an object and a reflected wave is received by the ultrasonic wave sensor 10, the controller 20 calculates a distance from the ultrasonic wave sensor 10 to the object based on a time from a transmission timing of the ultrasonic wave to a reception timing of the ultrasonic wave.

Hereinafter, the configuration of such a distance measurement device 1 will be described in detail.

Configuration of Ultrasonic Wave Sensor 10

Figure 2:
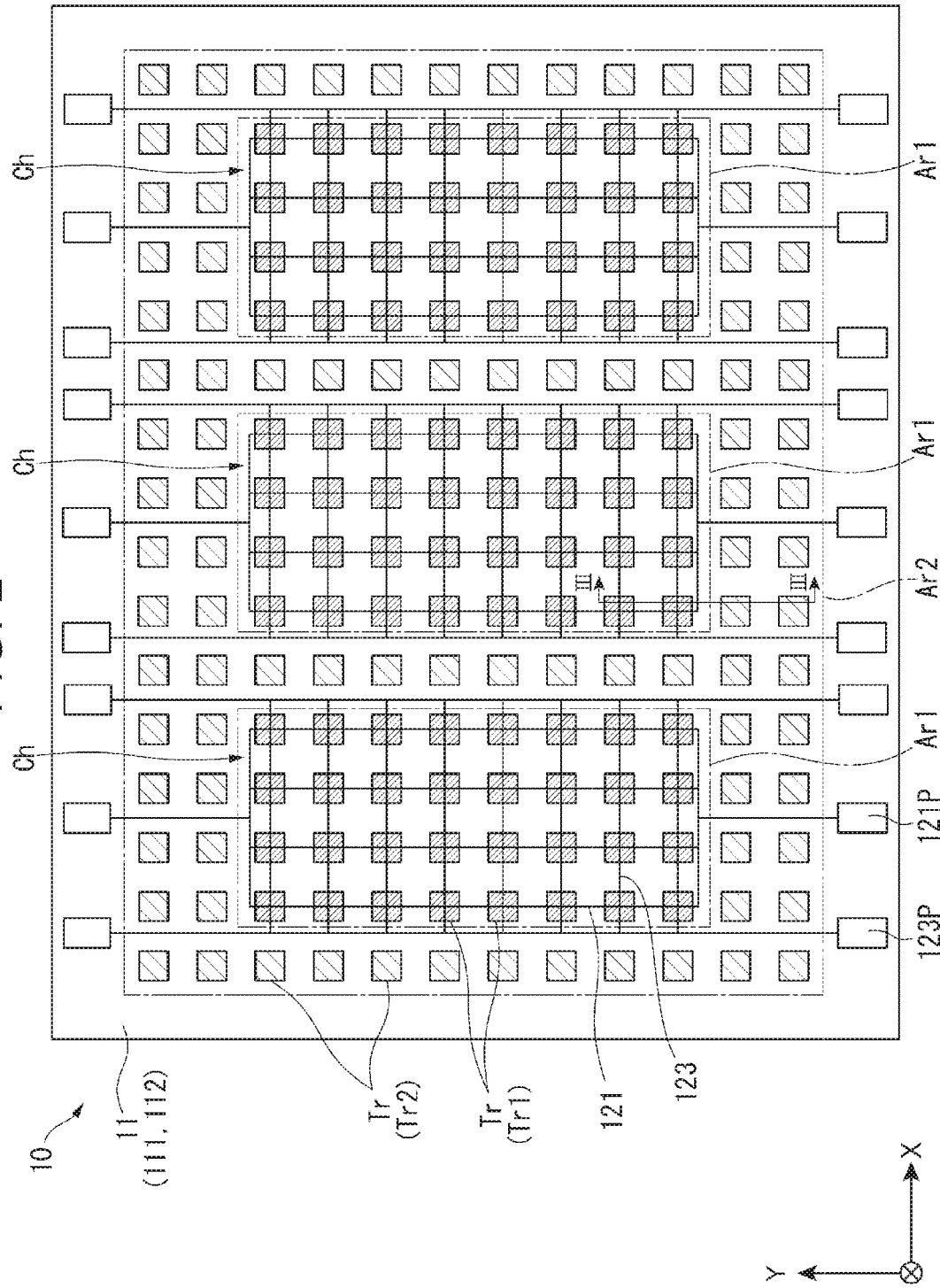
FIG. 2 is a plan view of a schematic configuration of an ultrasonic wave sensor according to the first embodiment.
Figure 3:
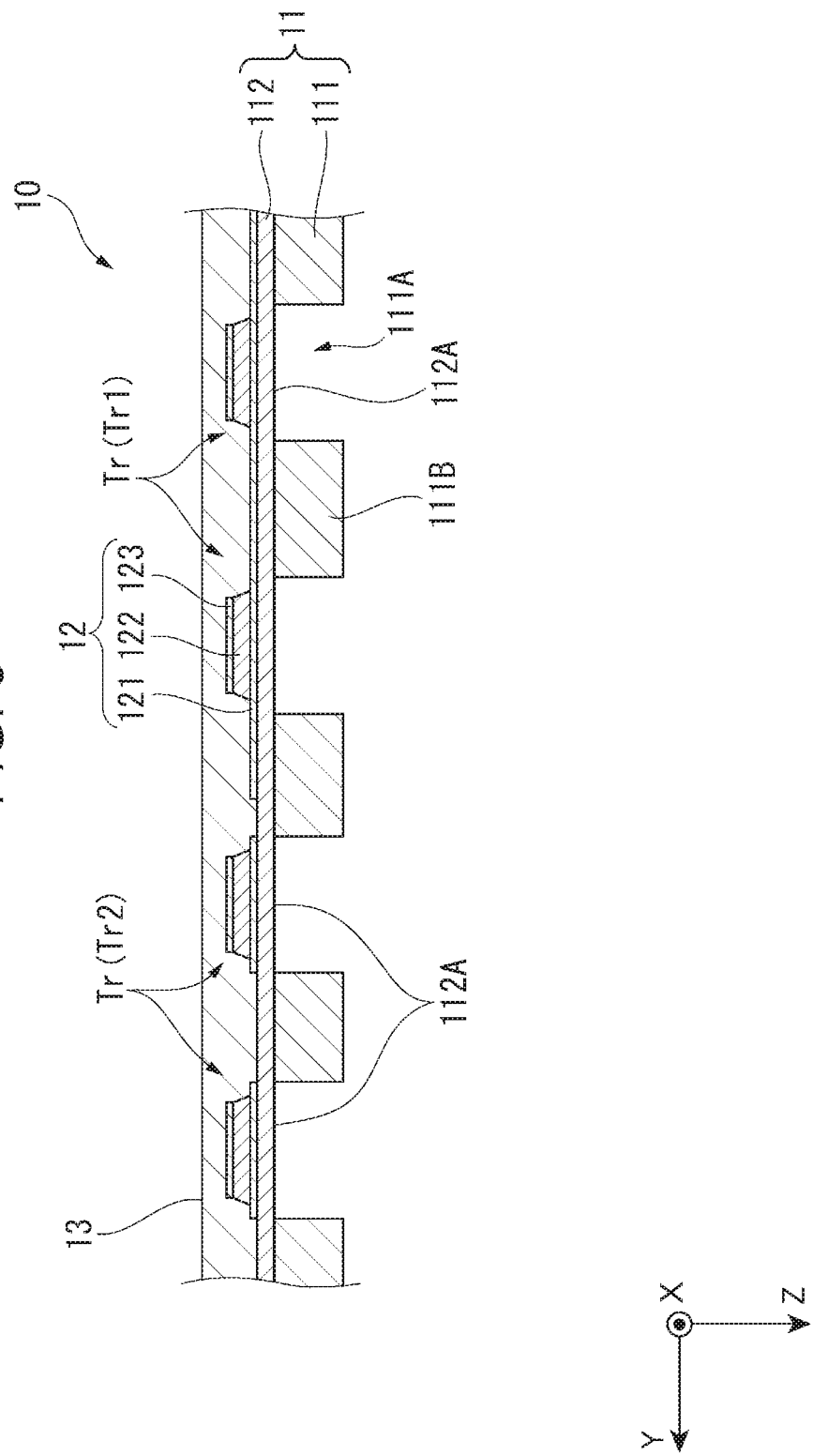
FIG. 3 is a cross-sectional view of the ultrasonic wave sensor taken along line III-III in FIG. 2.

FIG. 2 is a plan view of a schematic configuration of the ultrasonic wave sensor 10. FIG. 3 is a cross-sectional view of the ultrasonic wave sensor 10 taken along line in FIG. 2.

As shown in FIG. 3, the ultrasonic wave sensor 10 is configured by including an element substrate 11, a piezoelectric element 12, and a damper layer 13. Here, in the following description, a substrate thickness direction of the element substrate 11 is set as a Z direction and biaxial directions intersecting (orthogonal to in the embodiment) the Z direction are respectively set as an X direction (first direction) and a Y direction (second direction).

Configuration of Element Substrate 11

As shown in FIG. 3, the element substrate 11 includes a substrate main body portion 111 and an oscillating plate 112 provided on a −Z side of the substrate main body portion 111.

The substrate main body portion 111 is a substrate that supports the oscillating plate 112 and is configured of a semiconductor substrate such as Si. Here, a plurality of opening portions 111A disposed in a two-dimensional array along the X direction and the Y direction are provided in the element substrate 11.

In the embodiment, each opening portion 111A is a through-hole penetrating in the substrate thickness direction (Z direction) of the substrate main body portion 111, and the oscillating plate 112 is provided so as to block one end side (−Z side) of the through-hole. A portion of the substrate main body portion 111 where the opening portion 111A is not provided configures a wall portion 111B, and the oscillating plate 112 is laminated on this wall portion 111B.

The oscillating plate 112 is configured of, for example, $SiO_2$, a laminate of $SiO_2$ and $ZrO_2$, or the like, and is provided on the −Z side of the substrate main body portion 111. A thickness dimension of the oscillating plate 112 is sufficiently smaller than the substrate main body portion 111. This oscillating plate 112 is supported by the wall portion 111B of the substrate main body portion 111 configuring the opening portion 111A and blocks the −Z side of the opening portion 111A. A portion of the oscillating plate 112 overlapping with the opening portion 111A in plan view (portion blocking the opening portion 111A) configures an oscillator 112A. That is, the oscillator 112A of the oscillating plate 112 is surrounded by the wall portion 111B, and the outer edge of the oscillator 112A is defined by the opening portion 111A. This oscillator 112A is an oscillation area where the oscillation by the piezoelectric element 12 is possible.

Configuration of Piezoelectric Element 12

Each piezoelectric element 12 is provided on one surface of the oscillating plate 112 (−Z side surface) and at a position overlapping with each oscillator 112A in plan view as viewed from the Z direction. As shown in FIG. 3, this piezoelectric element 12 is configured of sequentially laminating a lower electrode 121, a piezoelectric layer 122, and an upper electrode 123 on the oscillating plate 112.

Here, one ultrasonic wave transducer Tr is configured of one oscillator 112A on the oscillating plate 112 and the piezoelectric element 12 provided on the oscillator 112A. Therefore, a plurality of the ultrasonic wave transducers Tr are disposed along the X direction and the Y direction in the ultrasonic wave sensor 10 as shown in FIG. 2.

In the ultrasonic wave transducer Tr having such a configuration, when a voltage is applied between the lower electrode 121 and the upper electrode 123, the piezoelectric layer 122 is expanded and contracted, and the oscillator 112A of the oscillating plate 112 provided with the piezoelectric element 12 oscillates at a frequency corresponding to an opening width or the like of the opening portion 111A. Accordingly, the ultrasonic wave is transmitted from a +Z side of the oscillator 112A (opening portion 111A side).

Further, when the ultrasonic wave is input to the opening portion 111A, the oscillator 112A oscillates due to the ultrasonic wave and a potential difference is generated between the upper and lower sides of the piezoelectric layer 122. Therefore, it is possible to detect (receive) the ultrasonic wave by detecting the potential difference generating between the lower electrode 121 and the upper electrode 123.

Configuration of Damper Layer 13

As shown in FIG. 3, the damper layer 13 is provided on the −Z side of the oscillating plate 112.

In the embodiment, the damper layer 13 covers the entire oscillating plate 112 and −Z side of each piezoelectric element 12 (that is, a surface on a side opposite to a side where ultrasonic wave is transmitted and received). In the damper layer 13, a portion overlapping with the piezoelectric element 12 is in close contact with a surface of the piezoelectric element 12, and a portion not overlapping with the piezoelectric element 12 is in close contact with the surface of −Z side of the oscillating plate 112, as viewed from the Z direction.

This damper layer 13 is configured of a material, for example, having Young's modulus of 130 MPa or less (for example, silicon or the like).

Disposition of Ultrasonic Wave Transducer Tr in Ultrasonic Wave Sensor 10

In the ultrasonic wave sensor 10 according to the embodiment, the ultrasonic wave transducers Tr configured of the oscillators 112A and the piezoelectric elements 12 are disposed in a two-dimensional array structure on an XY plane as shown in FIG. 2.

In the ultrasonic wave sensor 10 according to the embodiment, the oscillating plate 112 includes a first area Ar1 (drive area) and a second area Ar2 (resonance area). A plurality of the first areas Ar1 are disposed along the X direction, and the second area Ar2 is disposed so as to surround each first area Ar1.

First Area Ar1

A transmitter-receiver Ch (element group) configured of the ultrasonic wave transducers Tr (hereinafter, sometimes referred to as drive transducers Tr1) connected in parallel is disposed in the first area Ar1. Here, the piezoelectric element 12 of each drive transducer Tr1 configuring the transmitter-receiver Ch corresponds to a first piezoelectric element according to the invention.

Specifically, the lower electrode 121 is linearly formed straddling a column of the plurality of ultrasonic wave transducers Tr arranged in the Y direction in the first area Ar1. Further, a plurality (four in the example in FIG. 2) of the lower electrodes 121 arranged in the X direction in the first area Ar1 are connected to each other and are connected to, for example, drive terminals 121P provided on a peripheral portion of the oscillating plate 112.

On the other hand, the upper electrode 123 is linearly formed straddling a row of the plurality of ultrasonic wave transducers Tr arranged in the X direction in the first area Ar1, and a plurality of the upper electrodes 123 arranged in the X direction are connected to each other and are connected to common terminals 123P.

The drive terminals 121P and the common terminals 123P are respectively connected to the drive circuit 30. A drive signal is input from the drive circuit 30 to the drive terminals 121P, and a predetermined common potential (for example, −3 V) is applied to the common terminals 123P.

Here, the upper electrodes 123 are connected to be common in all the ultrasonic wave transducers Tr in the first area Ar1, but the invention is not limited thereto. For example, the upper electrodes 123 to which the common potential is applied may be common to each ultrasonic wave transducer Tr disposed in the ultrasonic wave sensor 10. That is, the upper electrodes 123 may be common to the ultrasonic wave transducers Tr in the first area Ar1 and the ultrasonic wave transducers Tr in the second area Ar2, and the common potential may be applied to the upper electrodes 123.

When the ultrasonic wave is transmitted from the ultrasonic wave sensor 10, the common potential is applied to the upper electrodes 123 and the drive signal is input to the lower electrodes 121 as described above. As shown in FIG. 2, since the drive terminals 121P are provided corresponding to each transmitter-receiver Ch, it is possible to independently input the drive signal to each transmitter-receiver Ch. Therefore, each transmitter-receiver Ch can be driven with delay, driven at the same time, or driven individually by selecting the drive terminals 121P that receive the drive signal from the drive circuit 30.

Second Area Ar2

The second area Ar2 is disposed on the outer side of the first area Ar1. In the embodiment, one ultrasonic wave transducer Tr in the X direction from end portions of each first area Ar1 and two ultrasonic wave transducers Tr in the Y direction therefrom are disposed to configure the second area Ar2.

The number of ultrasonic wave transducers Tr disposed in the second area Ar2 is not limited thereto. For example, an area where one ultrasonic wave transducer Tr is respectively disposed in the X direction and the Y direction from the first area Ar1 may be set as the second area Ar2, or an area where three or more ultrasonic wave transducers Tr are respectively disposed in the X direction and the Y direction from the first area Ar1 may be set as the second area Ar2.

Each ultrasonic wave transducer Tr (hereinafter, sometimes referred to as non-drive transducer Tr2) in the second area Ar2 is electrically insulated from the drive transducers Tr1. That is, the piezoelectric element 12 of the ultrasonic wave transducer Tr in the second area Ar2 corresponds to a second piezoelectric element according to the invention.

Specifically, since the lower electrode 121 of the non-drive transducer Tr2 is not connected (insulated) to the lower electrode 121 of the drive transducer Tr1, the drive signal is not input to the lower electrode 121 of the non-drive transducer Tr2. Further, since the upper electrode 123 of the non-drive transducer Tr2 is not connected to the upper electrode 123 of the drive transducer Tr1, the common potential is not applied to the upper electrode 123 of the non-drive transducer Tr2. The upper electrode 123 of the non-drive transducer Tr2 may be connected to the upper electrode 123 of the drive transducer Tr1, and thus the common potential may be applied to the upper electrode 123 of the non-drive transducer Tr2.

In such a non-drive transducer Tr2, the drive signal is not input thereto when the drive transducer Tr1 is driven.

In the embodiment, the oscillator 112A of the drive transducer Tr1 oscillates by driving each drive transducer Tr1 in the first area Ar1 at the time of the transmission of the ultrasonic wave, and this oscillation propagates to the second area Ar2 through the oscillating plate 112 (mechanical crosstalk). The oscillator 112A of each non-drive transducer Tr2 in the second area Ar2 resonates due to the influence of this mechanical crosstalk, and the ultrasonic wave is transmitted from each non-drive transducer Tr2 in the second area Ar2.

Here, each non-drive transducer Tr2 in the second area Ar2 is configured by disposing the piezoelectric element 12 on the oscillator 112A similarly to each drive transducer Tr1 in the first area Ar1. Accordingly, mechanical characteristics (natural frequency) of the ultrasonic wave transducer Tr can be made the same in the first area Ar1 and the second area Ar2. Therefore, when each oscillator 112A in the second area Ar2 resonates, each oscillator 112A in the second area Ar2 oscillates at the same frequency as each oscillator 112A in the first area Ar1 and the ultrasonic waves having the same frequency are transmitted from the first area Ar1 and the second area Ar2.

Configuration of Controller 20

The controller 20 is configured by including the drive circuit 30 that drives the ultrasonic wave sensor 10 and a calculator 40. Further, the controller 20 may additionally include a storage that stores various data, various programs, and the like for controlling the distance measurement device 1.

The drive circuit 30 is a driver circuit for controlling the driving of the ultrasonic wave sensor 10 and includes, for example, a reference potential circuit 31, a switching circuit 32, a transmission circuit 33, a reception circuit 34, and the like as shown in FIG. 1.

The reference potential circuit 31 is connected to the upper electrodes 123 of the ultrasonic wave sensor 10 and applies reference potential (for example, −3 V or the like) to the upper electrodes 123.

The switching circuit 32 is connected to the lower electrode 121 (drive terminal 121P) of each drive transducer Tr1 disposed in the first area Ar1, the transmission circuit 33, and the reception circuit 34. This switching circuit 32 is configured of a switching circuit, and switches between a transmission connection that connects each of the drive terminals 121P and the transmission circuit 33 and a reception connection that connects each of the drive terminals 121P and the reception circuit 34.

The transmission circuit 33 is connected to the switching circuit 32 and the calculator 40. When the switching circuit 32 is switched to the transmission connection, the transmission circuit 33 outputs the drive signal of a pulse waveform to each drive transducer Tr1 in the first area Ar1 based on the control of the calculator 40 to transmit the ultrasonic wave from the ultrasonic wave sensor 10.

Incidentally, in a case where the drive signal is input from the transmission circuit 33 to the plurality of ultrasonic wave transducers Tr, drive characteristics (driving characteristics) vary depending on the number of ultrasonic wave transducers Tr connected to the transmission circuit 33. That is, when it is assumed that a voltage of the drive signal that can be output from the transmission circuit 33 (voltage width from upper limit value to lower limit value) is Vp, a total electrostatic capacitance of the ultrasonic wave transducers Tr connected to the transmission circuit 33 is C, and a drive frequency of the drive signal is f, an effective current value I required for the transmission circuit 33 is represented by $I = \pi \cdot f \cdot C \cdot Vp / \sqrt{2}$.

Here, since the total electrostatic capacitance C also increases in a case where the number of ultrasonic wave transducers Tr connected to the transmission circuit 33 is large, it is necessary to increase a current capacity required for the transmission circuit 33 by that amount. Therefore, an expensive transmission circuit 33 having high current capacity is required depending on the number of ultrasonic wave transducers Tr connected in parallel. In other words, a case where the current capacity of the transmission circuit 33 is low with respect to the total electrostatic capacitance C of the ultrasonic wave transducers Tr connected to the transmission circuit 33 means that the drive characteristics of each ultrasonic wave transducer Tr are degraded.

On the contrary, in the embodiment, only the drive transducers Tr1 in the first area Ar1 of the ultrasonic wave sensor 10 are connected to the drive circuit 30, and the non-drive transducers Tr2 in the second area Ar2 are not connected to the drive circuit 30 as described above. That is, it is possible to suppress the number of drive transducers Tr1 connected to the transmission circuit 33 and to drive each drive transducer Tr1 with high driving characteristics.

The reception circuit 34 is connected to the switching circuit 32 and the calculator 40 and receives a reception signal from each lower electrode 121 when the switching circuit 32 is switched to the reception connection. This reception circuit 34 is configured by including, for example, a linear noise amplifier, an A/D converter, and the like. The reception circuit 34 implements each of signal processing such as conversion of the input reception signal into a digital signal, removing of a noise component, and amplification to a desired signal level, and then outputs the reception signal after the processing to the calculator 40.

The calculator 40 is configured of, for example, a central processing unit (CPU) and the like and controls the ultrasonic wave sensor 10 through the drive circuit 30 to cause the ultrasonic wave sensor 10 to implement a transmission and reception process of the ultrasonic wave.

That is, the calculator 40 switches the switching circuit 32 to the transmission connection and drives the ultrasonic wave sensor 10 from the transmission circuit 33 to implement the transmission process of the ultrasonic wave. Further, the calculator 40 switches the switching circuit 32 to the reception connection immediately after the transmission of the ultrasonic wave to cause the ultrasonic wave sensor 10 to receive the reflected wave reflected by the object. The calculator 40 calculates the distance from the ultrasonic wave sensor 10 to the object by a time-of-flight (ToF) method using, for example, the time from the transmission timing when the ultrasonic wave is transmitted from the ultrasonic wave sensor 10 to reception of the reception signal and sound velocity in the air.

First Modification Example of First Embodiment

In the first embodiment, all the ultrasonic wave transducers Tr disposed in the first area Ar1 are the drive transducers Tr1. On the contrary, the non-drive transducers Tr2 may be included in the first area Ar1.

Figure 4:
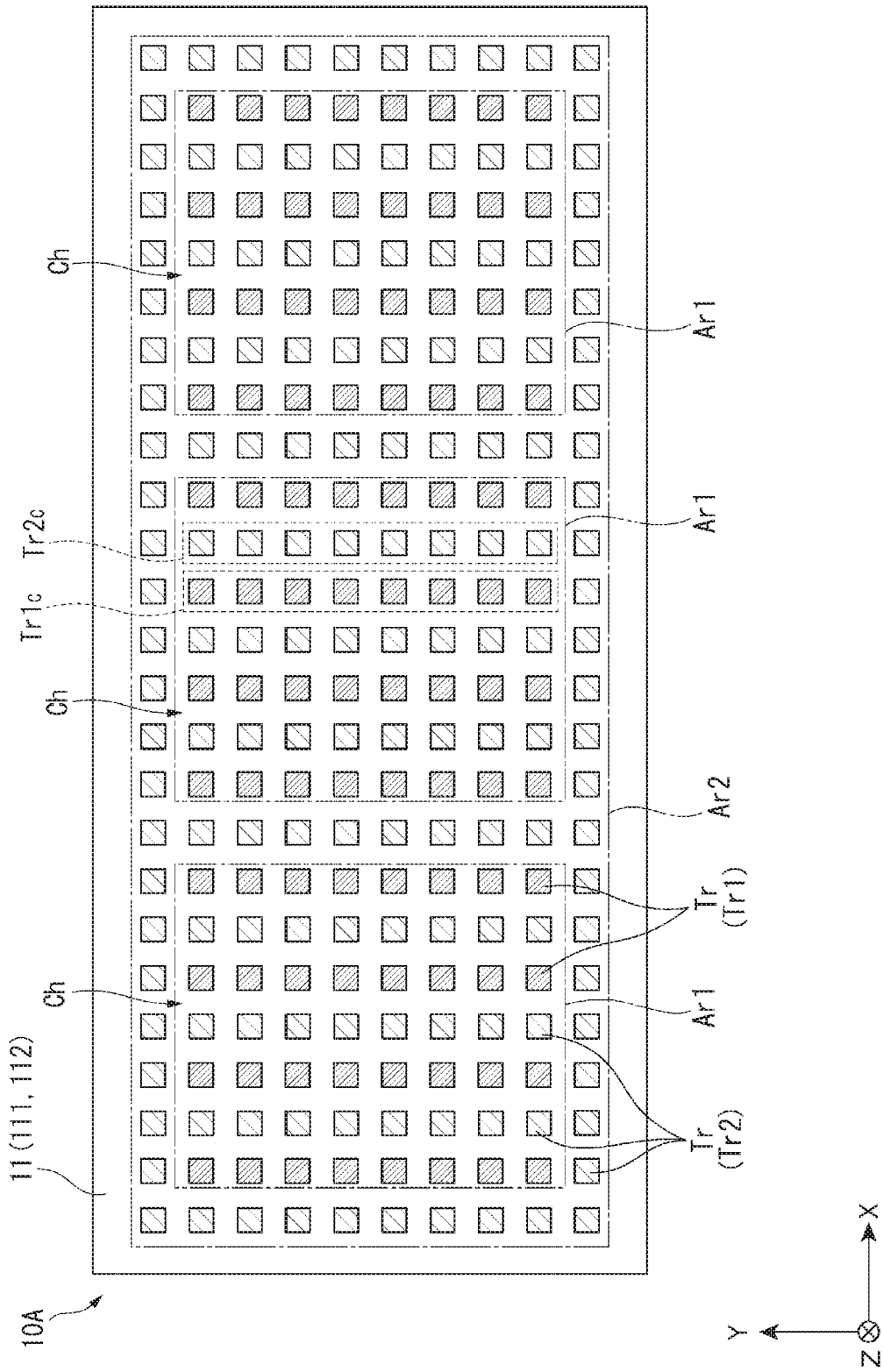
FIG. 4 is a plan view of a schematic configuration of an ultrasonic wave sensor according to a first modification example of the first embodiment.

FIG. 4 is a plan view of a schematic configuration of an ultrasonic wave sensor 10A according to a first modification example of the first embodiment. In FIG. 4, the illustrations of the lower electrodes 121, the upper electrodes 123, the drive terminals 121P, and the common terminals 123P are omitted.

In the ultrasonic wave sensor 10A as shown in FIG. 4, the oscillating plate 112 includes a plurality of the first areas Ar1 disposed in the X direction and the second area Ar2 disposed so as to surround the first areas Ar1 similarly to the first embodiment.

Here, in the first area Ar1 of the ultrasonic wave sensor 10A, the non-drive transducer Tr2 is disposed between the drive transducers Tr1 adjacent in the X direction as shown in FIG. 4. That is, a drive transducer column Tr1$_c$ in which the drive transducers Tr1 are disposed in the Y direction and a non-drive transducer column Tr2$_c$ in which the non-drive transducers Tr2 are disposed in the Y direction are alternately disposed in the X direction.

Further, the second area Ar2 is disposed so as to surround the first area Ar1 similarly to the first embodiment. In the example in FIG. 4, one ultrasonic wave transducer Tr (non-drive transducer Tr2) is respectively disposed in the X direction and the Y direction from the end portions of the first area Ar1 may be set as the second area Ar2 to form the second area Ar2. Further, one non-drive transducer Tr2 is disposed between the first areas Ar1 adjacent in the X direction.

As described in the first embodiment, the number of non-drive transducers Tr2 disposed in the second area Ar2 is not particularly limited. For example, similarly to the first embodiment, two non-drive transducers Tr2 may be disposed in the X direction and the Y direction from the end portions of each first area Ar1, and four non-drive transducers Tr2 may be disposed between the adjacent first areas Ar1.

In the ultrasonic wave sensor 10A as described above, in the first area Ar1, the non-drive transducer Tr2 is disposed between the drive transducers Tr1 adjacent in the X direction. In this case, the oscillation from the two drive transducers Tr1 propagates to the non-drive transducer Tr2 interposed between the two drive transducers Tr1 in the X direction. Therefore, oscillation amplitude when the oscillator 112A of the non-drive transducer Tr2 resonates is amplified, and thus a larger ultrasonic wave is transmitted from the ultrasonic wave sensor 10A as compared with, for example, a case where the oscillation from a single drive transducer Tr1 propagates.

Second Modification Example of First Embodiment

Figure 5:
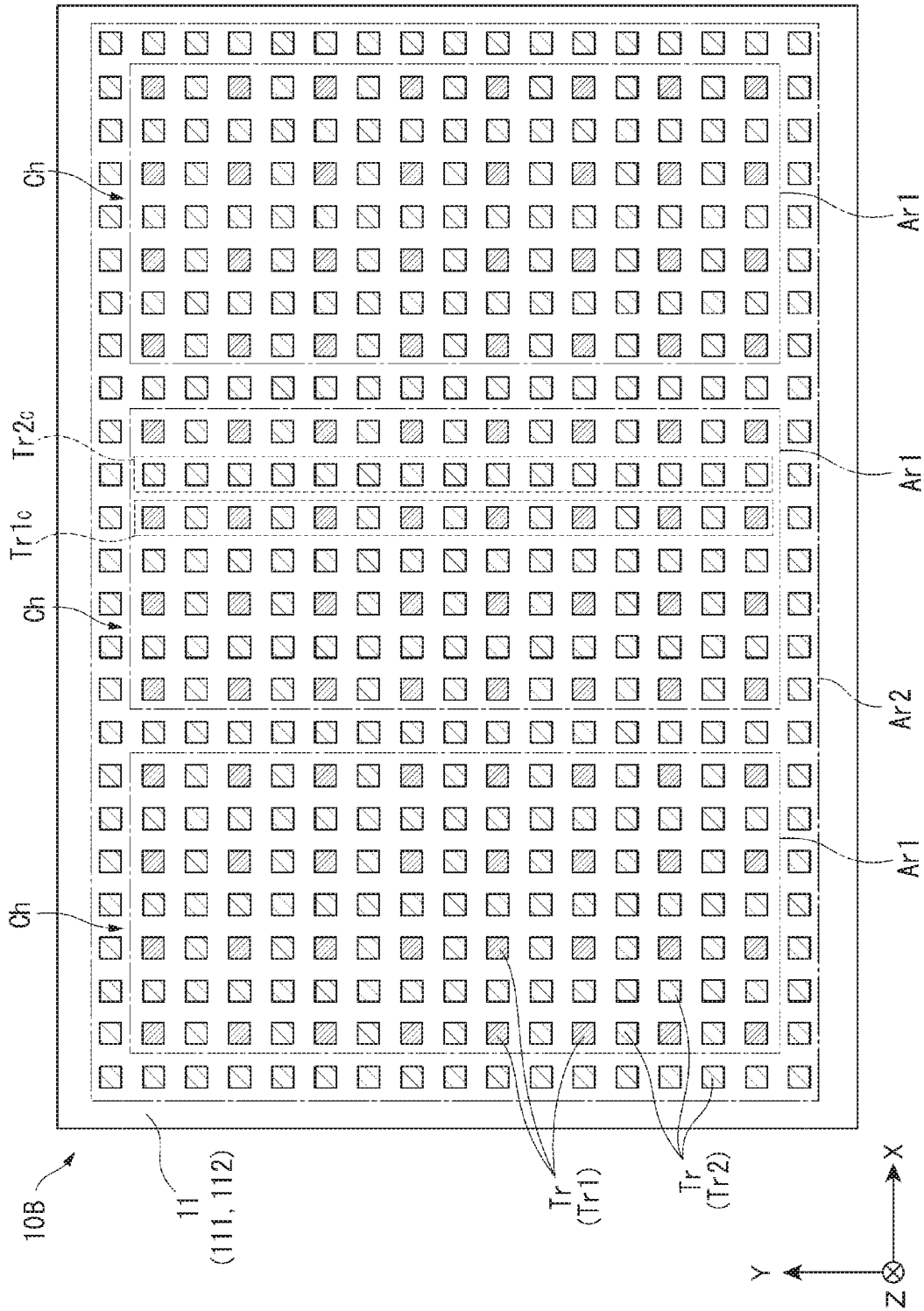
FIG. 5 is a plan view of a schematic configuration of an ultrasonic wave sensor according to a second modification example of the first embodiment.

FIG. 5 is a plan view of a schematic configuration of an ultrasonic wave sensor 10B according to a second modification example of the first embodiment. In FIG. 5, the illustrations of the lower electrodes 121, the upper electrodes 123, the drive terminals 121P, and the common terminals 123P are omitted.

In the ultrasonic wave sensor 10B as shown in FIG. 5, the oscillating plate 112 includes a plurality of the first areas Ar1 disposed in the X direction and the second area Ar2 disposed so as to surround the first areas Ar1 similarly to the ultrasonic wave sensor 10A.

Here, in the first area Ar1 of the ultrasonic wave sensor 10B, the non-drive transducer Tr2 is disposed between the drive transducers Tr1 adjacent in the X direction similarly to the ultrasonic wave sensor 10A.

Further, in the ultrasonic wave sensor 10B, the non-drive transducer Tr2 is further disposed between the drive transducers Tr1 adjacent in the Y direction in each drive transducer column Tr1$_c$.

With such an ultrasonic wave sensor 10B, the oscillation from the two drive transducers Tr1 propagates to the non-drive transducer Tr2 interposed between the two drive transducers Tr1 in the X direction similarly to the ultrasonic wave sensor 10A described above.

Further, the oscillation from the two drive transducers Tr1 propagates to the non-drive transducer Tr2 interposed between the two drive transducers Tr1 in the Y direction. Therefore, the oscillators 112A of the non-drive transducers Tr2 oscillate with larger amplitude as compared with the case where the oscillation from a single drive transducer Tr1 propagates, and thus the ultrasonic wave with high sound pressure is transmitted from the ultrasonic wave sensor 10B.

Sound Pressure Comparison

Next, the sound pressure of the ultrasonic wave when the ultrasonic wave sensors 10, 10A, and 10B according to the embodiment transmit the ultrasonic wave will be described.

Figure 6:
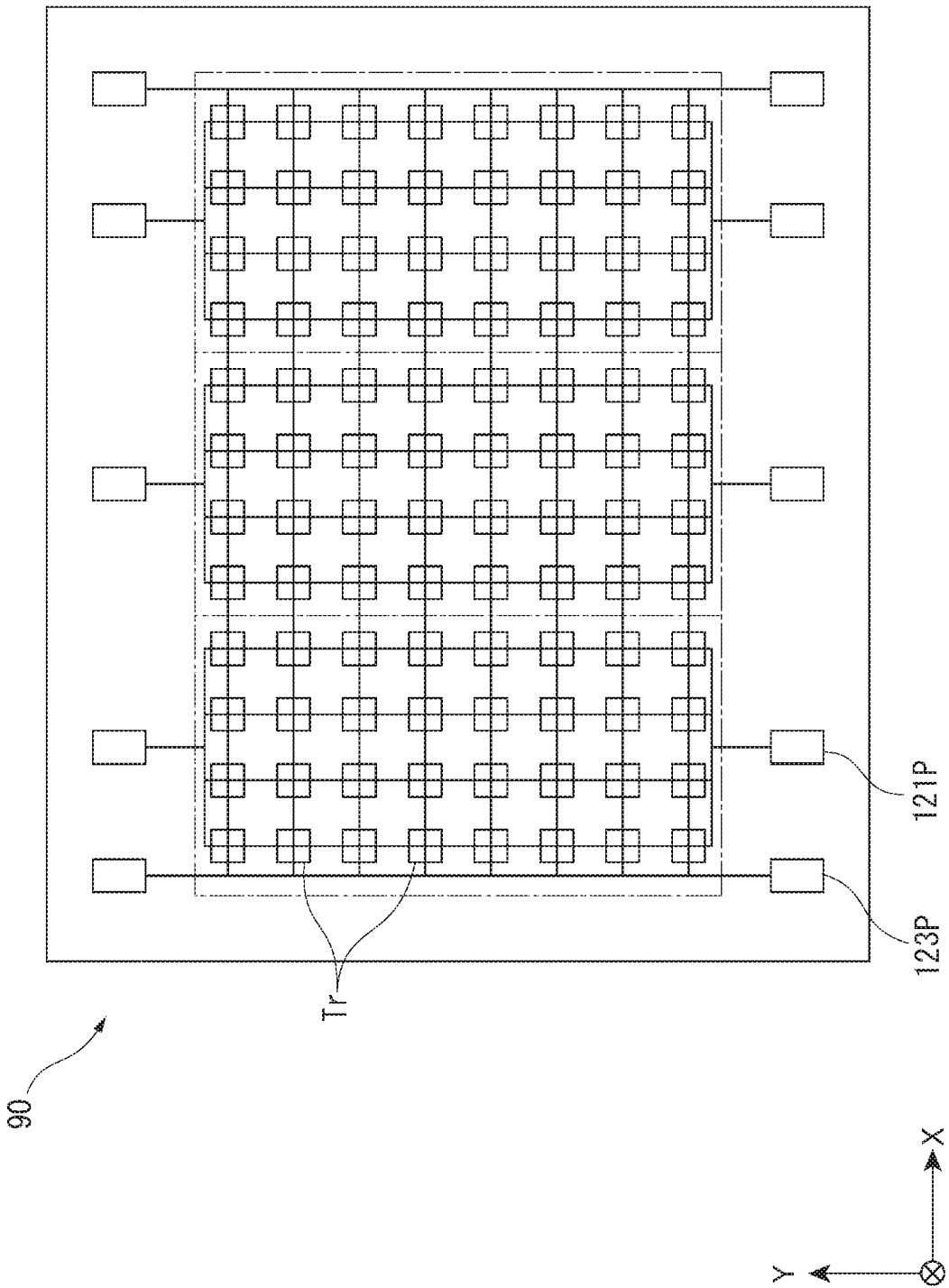
FIG. 6 is a plan view of a schematic configuration of an ultrasonic wave sensor according to a comparison example 1.

FIG. 6 is a plan view of a schematic configuration of an ultrasonic wave sensor 90 according to a comparison example 1. The ultrasonic wave sensor 90 shown in FIG. 6 is configured by disposing only the first area Ar1 of the ultrasonic wave sensor 10 in the X direction. That is, the non-drive transducer Tr2 is not provided in the ultrasonic wave sensor 90.

The following table 1 indicates the number of drive elements, the number of non-drive elements, the number of oscillation elements, and a standardized transmission sound pressure in the ultrasonic wave sensor 90 according to the comparison example 1 and the ultrasonic wave sensors 10, 10A, and 10B according to the embodiments.

Figure 7:
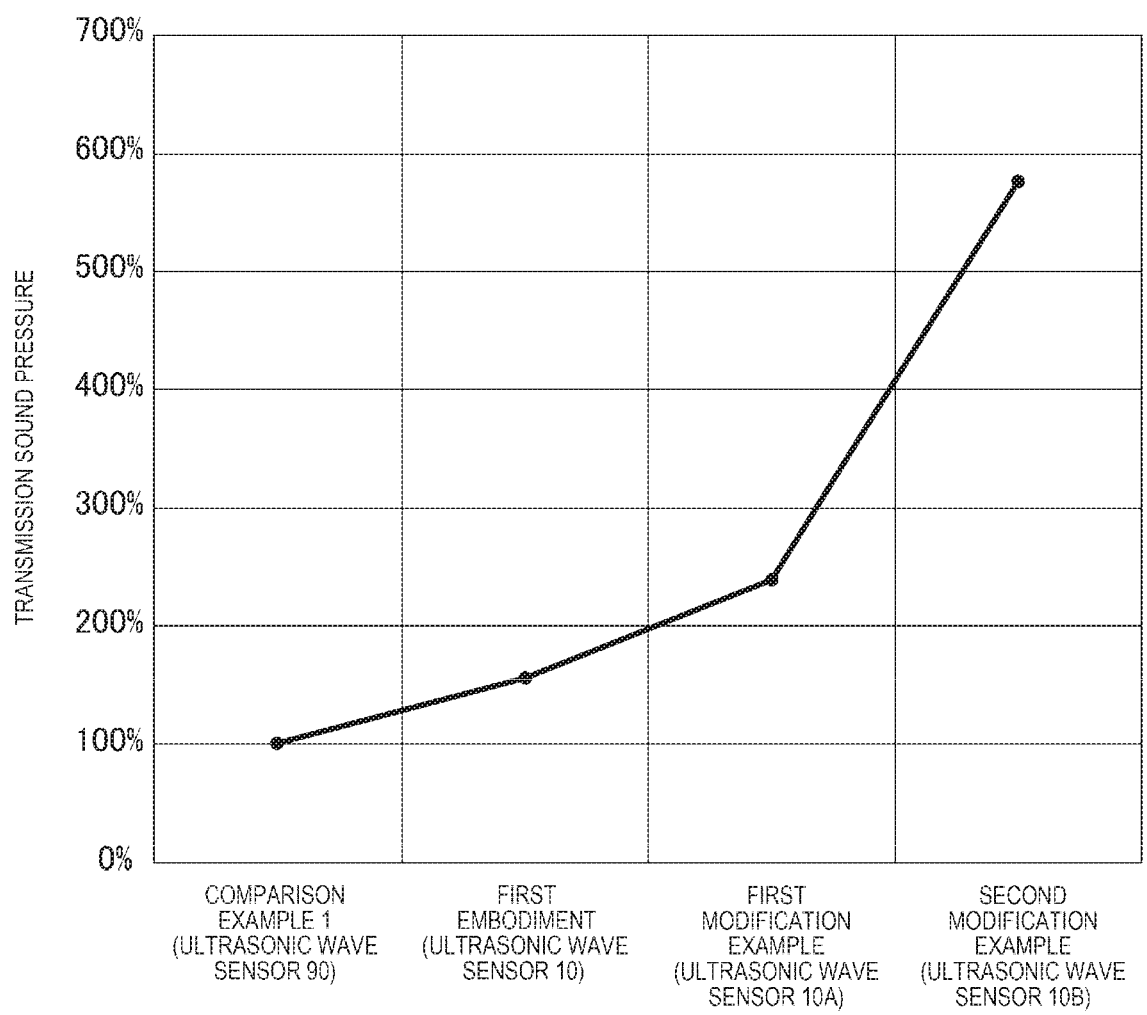
FIG. 7 is a comparison diagram of a transmission sound pressure according to the comparison example 1 and the embodiment.

Further, FIG. 7 is a graph representing a difference in the transmission sound pressure in the comparison example 1 and the embodiments.

TABLE 1

| | CH | Number of drive elements | Number of non-drive elements | Number of oscillation elements | Standardized transmission sound pressure |
|---|---|---|---|---|---|
| Comparison example 1 (ultrasonic wave sensor 90) | 3 | 96 | 0 | 96 | 100% |
| First embodiment (ultrasonic wave sensor 10) | 3 | 96 | 96 | 192 | 154% |
| First modification example (ultrasonic wave sensor 10A) | 3 | 96 | 154 | 250 | 187% |
| Second modification example (ultrasonic wave sensor 10B) | 3 | 96 | 329 | 425 | 285% |

Here, in table 1, the number of drive elements is the number of drive transducers Tr1 driven by the input of the drive signal. The number of non-drive elements is the number of non-drive transducers Tr2 to which the drive signal is not input. The number of oscillation elements is the number of ultrasonic wave transducers Tr whose oscillator 112A actually oscillates when the drive signal is input. The standardized transmission sound pressure indicates a magnitude of the sound pressure of the ultrasonic wave output from each of the ultrasonic wave sensors 90, 10, 10A, and 10B when the sound pressure of the ultrasonic wave transmitted from the ultrasonic wave sensor 90 according to the comparison example 1 is taken as 100%. The standardized transmission sound pressure indicates a result obtained by measuring the sound pressure of the ultrasonic wave transmitted in a case where each transmitter-receiver Ch is driven at the same time.

The ultrasonic wave sensor 90 according to the comparison example 1 and the ultrasonic wave sensors 10, 10A, and 10B according to the embodiments have the same number of drive elements. Therefore, in the ultrasonic wave sensor 90 according to the comparison example 1 and the ultrasonic wave sensors 10, 10A, and 10B according to the embodiments, the total electrostatic capacitance of the drive transducers Tr1 is the same value and the drive characteristics when the drive circuit 30 drives each ultrasonic wave transducer Tr are the same.

However, as shown in table 1 and FIG. 7, when the drive signal is input to the same number of ultrasonic wave transducers Tr, the ultrasonic waves having the sound pressure of 1.54 times in the ultrasonic wave sensor 10, the sound pressure of 1.87 times in the ultrasonic wave sensor 10A, and the sound pressure of 2.85 times in the ultrasonic wave sensor 10B can be obtained as compared with the ultrasonic wave sensor 90 according to the comparison example 1.

Action Effect of Embodiment

In the ultrasonic wave sensor 10 according to the embodiment, the piezoelectric element 12 is provided on each oscillator 112A of the oscillating plate 112 provided with the plurality of oscillators 112A to dispose the ultrasonic wave transducers Tr in a two-dimensional array. This oscillating plate 112 includes the plurality of first areas Ar1 arranged in the X direction and the second area Ar2 surrounding the first areas Ar1. The piezoelectric elements 12 (first piezoelectric elements) disposed on the predetermined number of oscillators 112A disposed in the first area Ar1 are connected to other piezoelectric elements 12 in parallel and configure the drive transducers Tr1 to which the input and the output of the drive signal are possible. On the other hand, the piezoelectric elements 12 (second piezoelectric elements) disposed on the oscillators 112A disposed in second area Ar2 are insulated from the drive transducer Tr1 and configure the non-drive transducers Tr2. In the embodiment, since the second area Ar2 is disposed between the first areas Ar1 adjacent along the X direction, the non-drive transducer Tr2 is disposed between the drive transducers Tr1 disposed along the X direction.

With such a configuration, when the drive signal is input to the drive transducer Tr1, the oscillator 112A of the drive transducer Tr1 oscillates to transmit the ultrasonic wave. In addition, the oscillator 112A of the non-drive transducer Tr2 resonates due to the propagation of the oscillation of the drive transducer Tr1 to the non-drive transducer Tr2. At this time, since the piezoelectric element 12 is disposed in the non-drive transducer Tr2 similarly to the drive transducer Tr1, the oscillator 112A of the non-drive transducer Tr2 oscillates with the same frequency as the oscillator 112A of the drive transducer Tr1. Accordingly, the ultrasonic wave having the same frequency as the ultrasonic wave generated by the drive transducer Tr1 is transmitted also from the non-drive transducer Tr2. Therefore, it is possible to transmit the ultrasonic wave with high sound pressure from the ultrasonic wave sensor 10.

Further, when the number of drive transducers is increased in order to increase the sound pressure of the ultrasonic wave transmitted from the ultrasonic wave sensor, the total electrostatic capacitance C increases and thus the drive characteristics are degraded. On the contrary, the non-drive transducer Tr2 insulated from the drive transducer Tr1 is provided in the ultrasonic wave sensor 10 according to the embodiment. Therefore, it is possible to improve the sound pressure without increasing the electric capacitance (electrostatic capacitance).

Furthermore, in the distance measurement device 1 (ultrasonic wave device) including such an ultrasonic wave sensor 10, it is unnecessary to increase, for example, the voltage of the drive signal or the like for transmitting the ultrasonic wave with high sound pressure as long as the drive circuit 30 in the related art is used. For example, the drive circuit 30 for driving the ultrasonic wave sensor 90 according to the comparison example 1 (configuration in the related art) as indicated by table 1 can be employed as it is in the ultrasonic wave sensor 10 according to the embodiment.

Further, in the ultrasonic wave sensor 10 according to the embodiment, the second area Ar2 is disposed so as to surround the periphery of the first area Ar1. That is, the non-drive transducers Tr2 are disposed not only between the first areas Ar1 adjacent in the X direction (±X sides) but also on ±Y sides of the first area Ar1.

That is, when each drive transducer Tr1 disposed in the first area Ar1 is driven, the oscillation propagates from the first area Ar1 in all directions through the oscillating plate 112. At this time, since the non-drive transducer Tr2 is disposed so as to surround the periphery of the first area Ar1, it is possible to propagate the oscillation spreading in all directions from the first area Ar1 to each non-drive transducer Tr2. Accordingly, the ultrasonic wave is transmitted from a large number of non-drive transducers Tr2 disposed on the periphery of the first area Ar1, and thus it is possible to further increase the sound pressure of the ultrasonic wave.

Further, as the ultrasonic wave sensor 10A according to the first modification example of the embodiment, the non-drive transducer Tr2 may be disposed between the drive transducers Tr1 adjacent in the X direction in the first area Ar1.

With such a configuration, the non-drive transducer Tr2 in the first area resonates by the driving of the drive transducer Tr1 in the first area, and thus it is possible to transmit the ultrasonic wave with high sound pressure. At this time, since the non-drive transducer Tr2 is interposed between the two drive transducers Tr1 in the X direction, the oscillations from the two drive transducers Tr1 propagate. Therefore, the oscillation amplitude when the oscillator 112A of the non-drive transducer Tr2 resonates becomes larger than the case where the oscillation from one drive transducer Tr1 propagates. Consequently, it is possible to further improve the transmission sound pressure of the ultrasonic wave.

Furthermore, as the ultrasonic wave sensor 10B according to the second modification example of the embodiment, the non-drive transducer Tr2 may be disposed between the drive transducers Tr1 adjacent in the Y direction in the first area Ar1.

In this case, it is possible to improve the transmission sound pressure of the ultrasonic wave by the resonance also for the non-drive transducer Tr2 interposed between the two drive transducers Tr1 in the Y direction. Accordingly, it is possible to transmit the ultrasonic wave with higher sound pressure.

Second Embodiment

Next, a second embodiment will be described. In the first embodiment described above, the plurality of first areas Ar1 (the plurality of channels of transmitter-receivers Ch) are provided in the X direction. On the contrary, the second embodiment differs from the first embodiment in that the ultrasonic wave sensor includes only one channel transmitter-receiver Ch. In the following description, the same reference numeral is assigned to the same configuration, and the description thereof is omitted or simplified.

Figure 8:
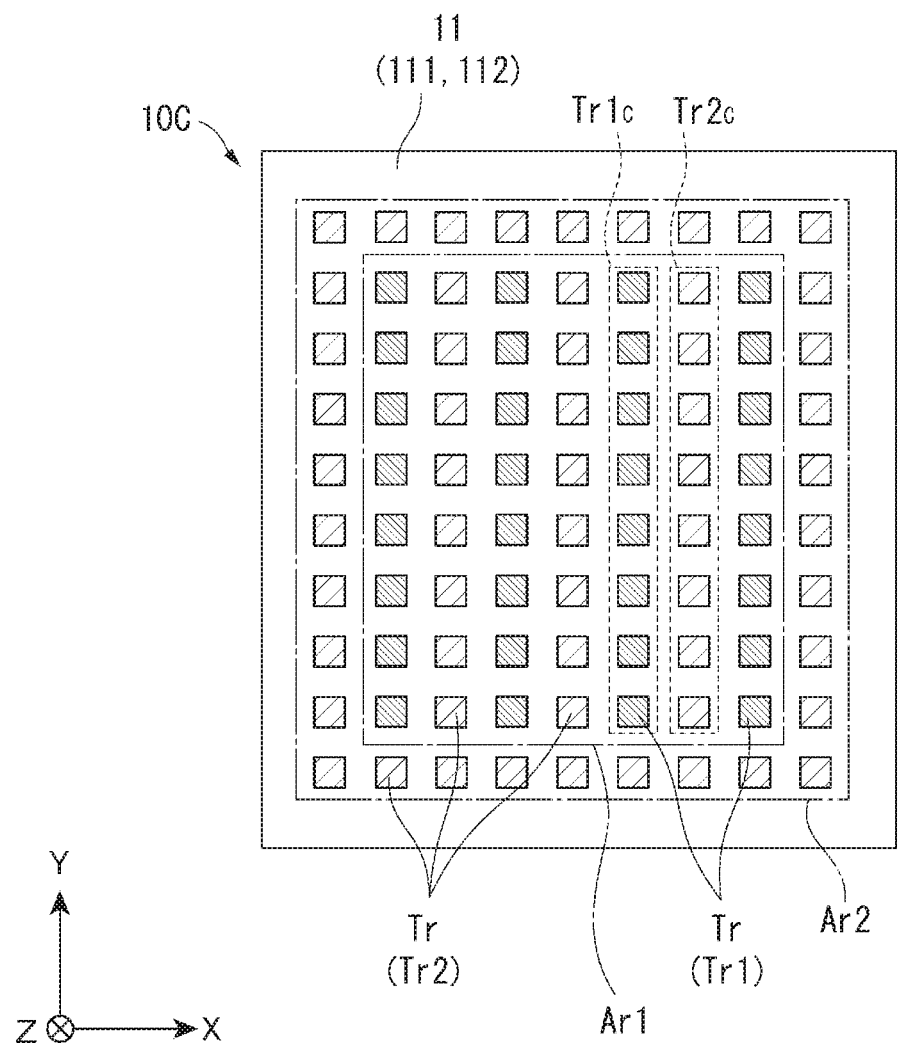
FIG. 8 is a plan view of a schematic configuration of an ultrasonic wave sensor according to a second embodiment.

FIG. 8 is a plan view of a schematic configuration of an ultrasonic wave sensor 10C according to the second embodiment. In FIG. 8, the illustrations of the lower electrodes 121, the upper electrodes 123, the drive terminals 121P, and the common terminals 123P are omitted.

As shown in FIG. 8, in the ultrasonic wave sensor 10C according to the embodiment, single first areas Ar1 and the second area Ar2 surrounding the first areas Ar1 are provided on the oscillating plate 112.

Here, the first area Ar1 of the embodiment has the same configuration as the first area Ar1 of the ultrasonic wave sensor 10A shown in the first modification example of the first embodiment.

That is, the first area Ar1 includes the drive transducer column $Tr1_c$ in which the plurality of drive transducers Tr1 are disposed in the Y direction and the non-drive transducer column $Tr2_c$ in which the plurality of non-drive transducers Tr2 are disposed in the Y direction. The drive transducer column $Tr1_c$ and the non-drive transducer column $Tr2_c$ are alternately disposed along the X direction.

Further, the non-drive transducer Tr2 is disposed between the drive transducers Tr1 adjacent in the X direction in FIG. 8, but a configuration like the ultrasonic wave sensor 10B shown in the second modification example of the first embodiment may be employed.

Figure 9:
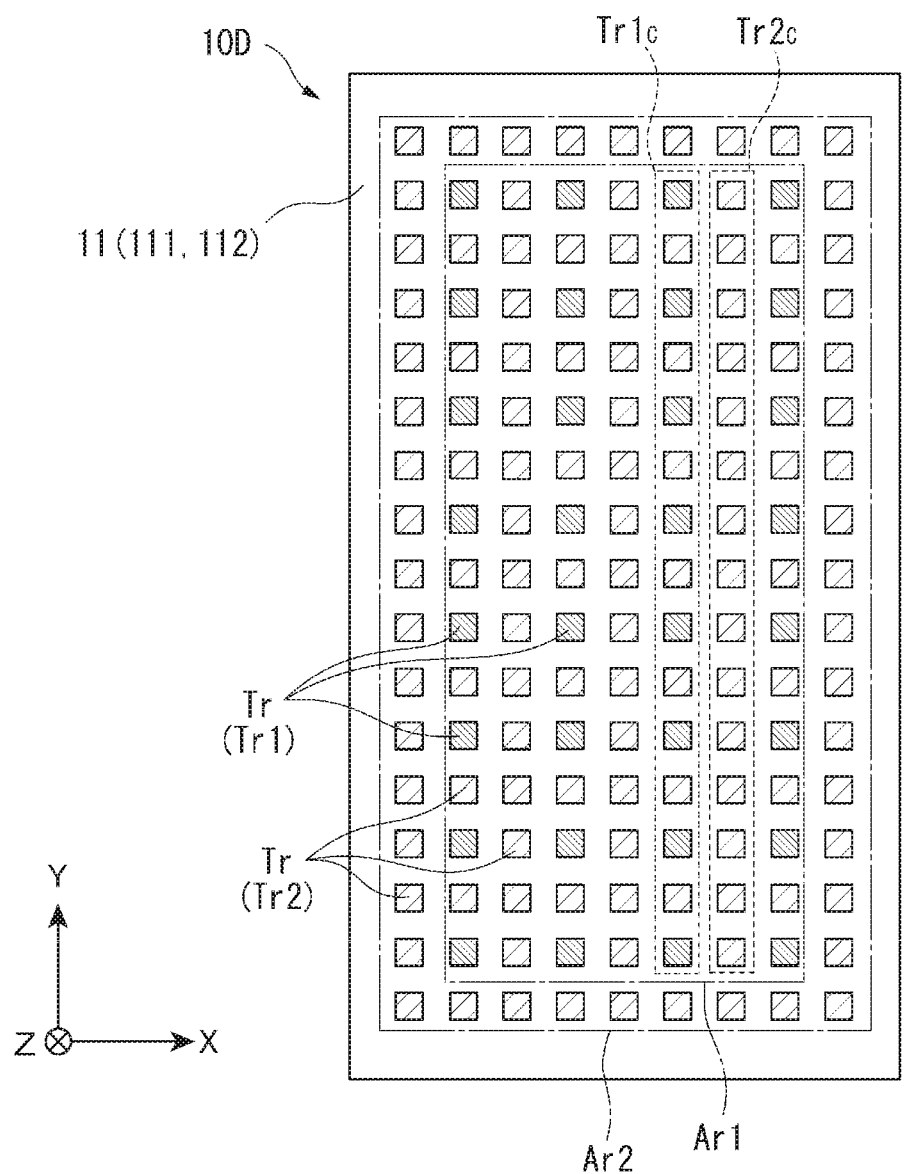
FIG. 9 is a plan view of a schematic configuration of an ultrasonic wave sensor according to a modification example of the second embodiment.

FIG. 9 is a plan view of a schematic configuration of an ultrasonic wave sensor 10D according to a modification example of the second embodiment. In FIG. 9, the illustrations of the lower electrodes 121, the upper electrodes 123, the drive terminals 121P, and the common terminals 123P are omitted.

For example, the non-drive transducer Tr2 may be respectively disposed between the drive transducers Tr1 arranged in the X direction and between the drive transducers Tr1 arranged in the Y direction in the first area Ar1 as shown in the ultrasonic wave sensor 10D.

In such ultrasonic wave sensors 10C and 10D, the plurality of drive transducers Tr1 (first piezoelectric elements) connected in parallel and the non-drive transducer Tr2 (second piezoelectric element) insulated from the drive transducer are included, and the non-drive transducer Tr2 is disposed between the drive transducers Tr1 adjacent in one direction (X direction or Y direction). Therefore, similarly to the ultrasonic wave sensors 10A and 10B, the oscillator 112A of the non-drive transducer Tr2 can resonate by the driving of the drive transducer Tr1, and thus it is possible to transmit the ultrasonic wave with high sound pressure from the ultrasonic wave sensors 10C and 10D.

Other Modification Examples

The invention is not limited to each embodiment described above and modification examples. The invention includes modifications and improvements within a range in which the purpose of the invention can be achieved and configurations obtained by appropriately combining each embodiment and the like.

Modification Example 1

For example, the lower electrode 121 of the non-drive transducer Tr2 is not connected to the drive circuit 30 in the embodiment described above, but the invention is not limited thereto.

Each lower electrode 121 of the non-drive transducers Tr2 may be connected to the drive circuit 30 by wiring different from the drive transducers Tr1. In this case, the switching circuit 32 may connect the drive transducers Tr1 and the transmission circuit 33 and may disconnect the non-drive transducers Tr2 and the transmission circuit 33 in the transmission connection. Accordingly, it is possible to oscillate each oscillator 112A of the non-drive transducers Tr2 by the resonance without degrading the drive characteristics and thus to increase the sound pressure of the transmitted ultrasonic wave.

Further, with such a configuration, the switching circuit 32 may connect both the drive transducers Tr1 and the non-drive transducers Tr2 to the reception circuit at the time of receiving the ultrasonic wave. In this case, it is possible to perform a reception process based on an added reception signal obtained by adding the reception signal from the drive transducers Tr1 and the reception signal from the non-drive transducers Tr2. The reception signal to be output from each ultrasonic wave transducer Tr when the ultrasonic wave is received is small as compared with the drive signal and thus is susceptible to noise and the like. On the contrary, it is possible to increase signal intensity of the reception signal by adding the reception signals from the drive transducers Tr1 and the non-drive transducer Tr2 and thus to suppress the influence of the noise and the like.

Modification Example 2

In the first embodiment, the second area Ar2 is provided so as to surround the periphery of the first area Ar1. On the contrary, the non-drive transducer Tr2 in the second area Ar2 may be provided only on the ±X sides of the first area Ar1, that is, between the first areas Ar1 adjacent in the X direction (between the drive transducers Tr1 adjacent in the X direction).

Further, the second area Ar2 may not be provided on the +X side and may be provided only on the −X side in the first area Ar1 located at an +X side end portion among the plurality of first areas Ar1 arranged in the X direction. The same applies to the first area Ar1 at an −X side end portion, and the second area Ar2 may be provided only on the +X side.

Modification Example 3

In the second embodiment, the second area Ar2 may not be provided. In this case, since the non-drive transducer Tr2 is also provided between the drive transducers Tr1 adjacent in the first area Ar1, the non-drive transducer Tr2 can resonate when the drive transducer Tr1 is driven and thus it is possible to transmit the ultrasonic wave with high sound pressure.

The same applies to the ultrasonic wave sensors 10A and 10B, and the non-drive transducer Tr2 in the second area Ar2 may not be provided since it is possible to improve the transmission sound pressure of the ultrasonic wave by the non-drive transducer Tr2 disposed in the first area Ar1.

Modification Example 4

The non-drive transducer Tr2 is disposed between the drive transducers Tr1 adjacent in the Y direction in each drive transducer column Tr1$_c$ provided in the first area Ar1 as the ultrasonic wave sensors 10B and 10D, but the invention is not limited thereto.

Figure 10:
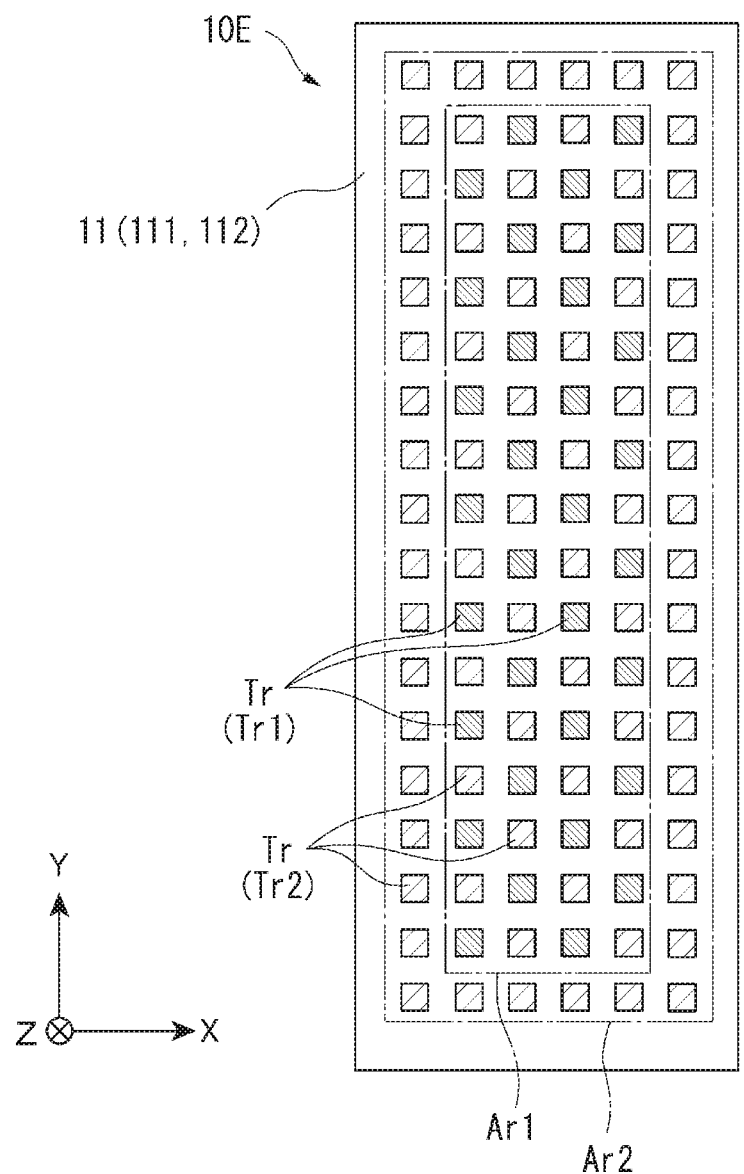
FIG. 10 is a plan view of a schematic configuration of an ultrasonic wave sensor according to a modification example 4.

FIG. 10 is a view of another example of the configuration in which the non-drive transducer Tr2 is disposed between the drive transducers Tr1 adjacent in the X direction and between the drive transducers Tr1 adjacent in the Y direction. In FIG. 10, the illustrations of the lower electrodes 121, the upper electrodes 123, the drive terminals 121P, and the common terminals 123P are omitted.

In an ultrasonic wave sensor 10E shown in FIG. 10, the drive transducer Tr1 and the non-drive transducer Tr2 are disposed in a zigzag pattern. That is, when a position of the ultrasonic wave transducer Tr disposed in a matrix on the XY plane in the first area Ar1 is represented by (x,y), the drive transducers Tr1 are disposed at coordinate positions of (2k−1,2k−1) and (2k,2k). Further, the non-drive transducers Tr2 are disposed at coordinate positions of (2k−1,2k) and (2k,2k−1). The positions of the drive transducers Tr1 and the non-drive transducers Tr2 may be opposite to each other.

With such a configuration, the non-drive transducer Tr2 in the first area Ar1 is surrounded by four drive transducers Tr1. Therefore, when the drive transducers Tr1 are driven, the oscillation propagates from the four directions of ±X sides and ±Y sides. Consequently, it is possible to further increase the oscillation amplitude when the oscillator 112A of the non-drive transducer Tr2 resonates.

Further, a size of the ultrasonic wave sensor 10 can be reduced as compared with the ultrasonic wave sensor 10D as can be understood by comparing FIGS. 10 and 9.

The ultrasonic wave sensor 10E shown in FIG. 10 is provided with only one channel transmitter-receiver Ch, but the plurality of transmitter-receivers Ch may be disposed in the X direction as shown in the first embodiment.

Modification Example 5

The plurality of first areas Ar1 (transmitter-receivers Ch) are disposed in the X direction in the first embodiment, but the invention is not limited thereto.

For example, the plurality of first areas Ar1 (transmitter-receivers Ch) may be disposed in the X direction and the Y direction. That is, the plurality of first areas Ar1 (transmitter-receivers Ch) may be disposed in the two-dimensional array structure. In this case, the second area Ar2 is provided so as to surround the first area Ar1 (the second area Ar2 is respectively provided between the first areas Ar1 adjacent in the X direction and between the first areas Ar1 adjacent in the Y direction). Accordingly, when each transmitter-receiver Ch is driven, the non-drive transducer Tr2 in the second area Ar2 can resonate and thus it is possible to increase the transmission sound pressure of the ultrasonic wave.

Modification Example 6

The distance measurement device 1 is exemplified as an example of the ultrasonic wave device in the first embodiment, but the invention is not limited thereto. For example, an ultrasonic wave measurement device that measures the inner tomogram of a structure according to a transmission-reception result of the ultrasonic wave or the like may be employed.

In addition, a specific structure when implementing the invention may be a configuration of appropriately combining each embodiment and the modification examples described above within the range in which the purpose of the invention can be achieved, or may be appropriately changed to other structures and the like.

The entire disclosure of Japanese Patent Application No. 2018-061550, filed Mar. 28, 2018 is expressly incorporated by reference herein.

What is claimed is:

1. An ultrasonic wave sensor comprising:
   a substrate, the substrate having:
      an oscillating plate including a plurality of oscillators; and
      a wall provided on the oscillating plate, the wall surrounding the plurality of oscillators;

a plurality of piezoelectric elements disposed on the oscillating plate, the plurality of piezoelectric elements corresponding to the plurality of oscillators, the plurality of piezoelectric elements being arranged along a first axis and a second axis orthogonal to the first axis in a matrix, the plurality of piezoelectric elements being divided into:
- a plurality of first piezoelectric elements, the plurality of first piezoelectric elements being divided into a first group and a second group, each of the first group and the second group being configured with a plurality of columns of the plurality of first piezoelectric elements along the second axis; and
- a plurality of second piezoelectric elements, the plurality of second piezoelectric elements being configured with a third group and a fourth group, each of the third group and the fourth group being configured with one column of the plurality of second piezoelectric elements along the second axis;

a first common terminal disposed on the substrate along a first side of the substrate, the first side extending along the first axis; and
a second common terminal disposed on the substrate along the first side,
wherein a drive signal is supplied to the plurality of first piezoelectric elements and a common potential is supplied to the plurality of first piezoelectric elements via the first and second common terminals to generate an oscillation in the oscillation plate by deformation of the plurality of first piezoelectric elements, and a first one of the plurality of first piezoelectric elements is connected to a second one of the plurality of first piezoelectric elements in each of the first group and the second group,
the plurality of second piezoelectric elements are electrically insulated from the plurality of first piezoelectric elements, and the drive signal is not supplied to the plurality of second piezoelectric elements,
the third group is sandwiched between the first group and the second group along the first axis, and the second group is sandwiched between the third group and the fourth group along the first axis, and
the first common terminal is aligned with an extending line of a first border between the first group and the third group, and the second common terminal is aligned with an extending line of a second border between the second group and the fourth group.

2. The ultrasonic wave sensor according to claim 1,
wherein the first and second groups and the third and fourth groups are alternately arranged along the first axis.

3. The ultrasonic wave sensor according to claim 1,
wherein the plurality of second piezoelectric elements are further configured with a first sub group of the plurality of second piezoelectric elements and a second sub group of the plurality of second piezoelectric elements in addition to the one column of the third group and the one column of the fourth group, and
each of the first sub group and the second sub group is located next to the second group of the plurality of first piezoelectric elements along the second axis.

4. The ultrasonic wave sensor according to claim 3,
wherein the second group is surrounded by the third group, the fourth group, the first sub group, and the second sub group when viewed along a third axis orthogonal to the first axis and the second axis.

5. The ultrasonic wave sensor according to claim 3,
wherein each of the first sub group and the second sub group is configured with a row of the plurality of second piezoelectric elements along the first axis.

6. An ultrasonic wave device comprising:
an ultrasonic wave sensor, the ultrasonic wave sensor including:
a substrate, the substrate having:
an oscillating plate including a plurality of oscillators; and
a wall provided on the oscillating plate, the wall surrounding the plurality of oscillators;
a plurality of piezoelectric elements disposed on the oscillating plate, the plurality of piezoelectric elements corresponding to the plurality of oscillators, the plurality of piezoelectric elements being arranged along a first axis and a second axis orthogonal to the first axis in a matrix, the plurality of piezoelectric elements being divided into:
- a plurality of first piezoelectric elements, the plurality of first piezoelectric elements being divided into a first group and a second group, each of the first group and the second group being configured with a plurality of columns of the plurality of first piezoelectric elements along the second axis; and
- a plurality of second piezoelectric elements, the plurality of second piezoelectric elements being configured with a third group and a fourth group, each of the third group and the fourth group being configured with one column of the plurality of second piezoelectric elements along the second axis;

a first common terminal disposed on the substrate along a first side of the substrate, the first side extending along the first axis;
a second common terminal disposed on the substrate along the first side; and
a drive circuit configured to supply a drive signal to the plurality of first piezoelectric elements,
wherein the drive signal is supplied to the plurality of first piezoelectric elements and a common potential is supplied to the plurality of first piezoelectric elements via the first and second common terminals to generate an oscillation in the oscillation plate by deformation of the plurality of first piezoelectric elements, and a first one of the plurality of first piezoelectric elements is connected to a second one of the plurality of first piezoelectric elements in each of the first group and the second group,
the plurality of second piezoelectric elements are electrically insulated from the plurality of first piezoelectric elements, and the drive signal is not supplied to the plurality of second piezoelectric elements,
the third group is sandwiched between the first group and the second group along the first axis, and the second group is sandwiched between the third group and the fourth group along the first axis, and
the first common terminal is aligned with an extending line of a first border between the first group and the third group, and the second common terminal is aligned with an extending line of a second border between the second group and the fourth group.

7. The ultrasonic wave device according to claim 6,
wherein the first and second groups and the third and fourth groups are alternately arranged along the first axis.

8. The ultrasonic wave device according to claim 6,
wherein the plurality of second piezoelectric elements has are further configured with a first sub group of the plurality of second piezoelectric elements and a second sub group of the plurality of second piezoelectric elements in addition to the one column of the third group and the one column of the fourth group, and
each of the first sub group and the second sub group is located next to the second group of the plurality of first piezoelectric elements along the second axis.

9. The ultrasonic wave device according to claim 8,
wherein the second group is surrounded by the third group, the fourth group, the first sub group, and the second sub group when viewed along a third axis orthogonal to the first axis and the second axis.

10. The ultrasonic wave device according to claim 8,
wherein each of the first sub group and the second sub group is configured with a row of the plurality of second piezoelectric elements along the first axis.

\* \* \* \* \*